(12) United States Patent
Dollar, II et al.

(10) Patent No.: US 6,545,479 B1
(45) Date of Patent: Apr. 8, 2003

(54) PORTABLE TESTER FOR ELECTRONIC CIRCUIT BREAKER

(75) Inventors: Charles Randall Dollar, II, Norcross, GA (US); Mario Bilac, Lawrenceville, GA (US); Jerry M. Green, Tucker, GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 09/435,187

(22) Filed: Nov. 5, 1999

(51) Int. Cl.[7] .................. G01R 31/02; G01R 31/06; H01H 31/02
(52) U.S. Cl. ................ 324/424; 324/537; 324/546; 324/547
(58) Field of Search .................. 324/424, 537, 324/546, 547, 555, 556, 726; 340/638; 361/94, 93, 56, 96

(56) References Cited

U.S. PATENT DOCUMENTS

| | | | | |
|---|---|---|---|---|
| 3,848,159 A | * | 11/1974 | Nye, Jr. et al. | 361/45 |
| 3,924,160 A | * | 12/1975 | Maier et al. | 328/28 |
| 4,060,844 A | * | 11/1977 | Davis et al. | 361/96 |
| 4,115,829 A | * | 9/1978 | Howell | 361/73 |
| 4,351,992 A | | 9/1982 | Crouch | 200/144 |
| 4,541,030 A | * | 9/1985 | Biegelmeir | 361/56 |
| 4,549,241 A | | 10/1985 | Morris et al. | 361/45 |
| 4,634,981 A | * | 1/1987 | Shimp et al. | 324/424 |
| 4,714,975 A | | 12/1987 | Dvorak | 361/44 |
| 4,803,434 A | * | 2/1989 | Walker | 324/424 |
| 4,814,712 A | | 3/1989 | Burton et al. | 324/424 |
| 4,870,532 A | * | 9/1989 | Beatty, Jr. et al. | 361/93 |
| 4,977,513 A | * | 12/1990 | LaPalme | 324/424 X |
| 4,982,173 A | | 1/1991 | Meiners et al. | 355/21 |
| 5,075,658 A | | 12/1991 | Lesslie et al. | 335/14 |
| 5,107,236 A | | 4/1992 | Lesslie et al. | 335/132 |
| 5,185,580 A | | 2/1993 | Nichols, III et al. | 324/539 |
| 5,272,438 A | * | 12/1993 | Stumme | 324/424 |
| 5,293,522 A | | 3/1994 | Fello et al. | 335/18 |
| 5,317,295 A | | 5/1994 | Ferullo et al. | 335/172 |
| 5,371,646 A | * | 12/1994 | Biegelmeier | 361/47 |
| 5,434,509 A | * | 7/1995 | Blades | 324/536 |
| 5,436,785 A | * | 7/1995 | Ferrazzi et al. | 361/42 |
| 5,444,377 A | | 8/1995 | Del Vecchio et al. | 324/424 |
| 5,446,386 A | | 8/1995 | Pollman et al. | 324/424 |
| 5,710,513 A | | 1/1998 | March | 324/424 |
| 5,910,875 A | | 6/1999 | Tian et al. | 361/78 |
| 5,956,218 A | * | 9/1999 | Berthold | 361/42 |
| 6,018,451 A | * | 1/2000 | Lyke et al. | 361/93.2 |
| 6,034,859 A | * | 3/2000 | Baumgartl | 361/93.6 |

FOREIGN PATENT DOCUMENTS

JP 11299022 A * 10/1999 ........... G01R/31/00

* cited by examiner

Primary Examiner—N. Le
Assistant Examiner—Wasseem H. Hamdan

(57) ABSTRACT

A portable circuit breaker tester (10) for testing a current transformer (30, 32, 34, 36) of a circuit breaker (18) having a first terminal (30e, 32e) on a first end of the transformer and a second terminal (138) on a second end of the transformer has a test port (14) configured to be coupled to the first (30e, 32e) and second terminals (138) and a test circuit (68, 74, 96, 104, 146) coupled to the test port (14). The test circuit (68, 74, 96, 104, 146) is configured to provide a test current through the test port (14) to the first terminal (30e, 32e), to monitor the second terminal (138) through the test port (14), and to provide an output signal to an indicia (38, 40) based on whether the test current is received at the second terminal (138). The test circuit (68, 74, 96, 104, 146) is configured to perform first and second testing operations on the circuit breaker (18) through the test port (14). During the first testing operation the test circuit (68, 74, 96, 104, 146) provides a test signal to a terminal (30e, 32e, 138) coupled to the current transformer and during the second testing operation the test circuit (68, 74, 96, 104, 146) provides power to the circuit breaker (18).

18 Claims, 9 Drawing Sheets

PORTABLE TESTER FOR ELECTRONIC CIRCUIT BREAKER

FIELD OF THE INVENTION

The present invention relates generally to the field of electronic circuit breakers and more specifically to the field of testers for electronic circuit breakers.

BACKGROUND OF THE INVENTION

An electronic circuit breaker is used to interrupt an electric circuit under an abnormal condition, such as a power surge or a ground fault. An electronic circuit breaker is rated at a predetermined amperage which indicates the threshold current passing through the breaker which will trip the breaker, causing it to interrupt the electric circuit. The tester of the present invention is particularly suited for testing circuit breakers having threshold current ratings of between 63 and 1600 Amperes, though the tester may find applications involving the testing of other circuit breakers as well.

Circuit breakers require regular testing by maintenance personnel to ensure they are functioning properly. Circuit breakers also sometimes require testing to troubleshoot breaker malfunctions. During routine maintenance or breaker troubleshooting, a tester is coupled to each circuit breaker to test the functionality of the circuit breaker. Problems are diagnosed based on the test, and the circuit breaker is repaired or replaced as needed.

Some present-day testers are large and unwieldy, typically comprising a suitcase-sized box (e.g., eighteen inches by twelve inches by six inches). These testers include a full-sized keyboard and display. These testers perform many tests on the circuit breakers, some of which may not be necessary to provide a reasonable diagnosis of the functionality of the circuit breaker. The size and complexity of these testers makes them difficult to use and transport in many applications, particularly when the maintenance personnel must travel to the work site.

One portable tester performs a "dry" test and a primary injection test. The dry test subjects the breaker to simulated phase overload and simulated ground fault tests. Primary injection testing verifies the wiring outside of the circuit breaker. However, both tests are not necessary for all testing situations. Also, this tester fails to test the continuity of the current transformer within the circuit breaker which, it has been found, yields a great deal of test data regarding the condition of a circuit breaker.

Accordingly, what is needed is a portable tester which performs the necessary test functions to provide a reasonably reliable diagnosis of the circuit breaker, yet is simple to use by minimally trained personnel. The portable tester would also test the continuity of the current transformer inside the circuit breaker. Furthermore, the portable tester would be able to trip a circuit breaker even when the tester is operating on battery power.

SUMMARY OF THE INVENTION

One embodiment of the invention relates to a circuit breaker tester for testing a current transformer of a circuit breaker, the current transformer having a first terminal on a first end of the transformer and a second terminal on a second end of the transformer. The circuit breaker tester comprises a test port configured to be coupled to the first and second terminals and a test circuit coupled to the test port and configured to provide a test current through the test port to the first terminal, to monitor the second terminal through the test port, and to provide an output signal to an indicia based on whether the test current is received at the second terminal.

According to another embodiment, a portable tester for testing a circuit breaker having an electronic module and a current transformer includes a housing configured to be held in a hand, a test port, and a test circuit. The test port is coupled to the housing and configured for coupling to the circuit breaker. The test circuit is coupled to the housing and the test port and is configured to perform first and second testing operations on the circuit breaker through the test port. During the first testing operation the test circuit provides a test signal to a terminal coupled to the current transformer and during the second testing operation the test circuit provides power to the electronic module of the circuit breaker.

According to yet another embodiment, a portable tester for performing an overcurrent test on a circuit breaker having an electronic module, a trip unit, and a current transformer is disclosed. The electronic module has an adjustable trip current and a rating. The portable tester includes a housing configured to be held in a hand, a battery terminal configured to be coupled to a battery, a test port coupled to the housing and configured for coupling to the circuit breaker, and a test circuit coupled to the housing, the battery, and the test port. The test circuit is configured to provide power to the electronic module of the circuit breaker and to provide a test current from the battery to the trip unit to perform an overcurrent test on the trip unit, wherein the test current has a magnitude less than the rating associated with the trip unit.

According to still another embodiment, a circuit breaker tester for testing a current transformer of a circuit breaker includes a means for providing a test current through the current transformer, a means for receiving the test current from the current transformer, and a means for providing an output signal to an indicia based on whether the test current is received at the means for receiving.

According to yet another embodiment, a portable circuit breaker tester for testing a circuit breaker having an electronic module and at least one current transformer consists of a means for testing the continuity of the at least one current transformer and a means for powering the electronic module and for performing an overcurrent test on the circuit breaker.

BRIEF DESCRIPTION OF THE DRAWINGS

Exemplary embodiments will hereinafter be described with reference to the accompanying drawings, wherein like reference numerals refer to like elements, and.

DETAILED DESCRIPTION OF THE PREFERRED EMBODIMENTS

Figure 1A:
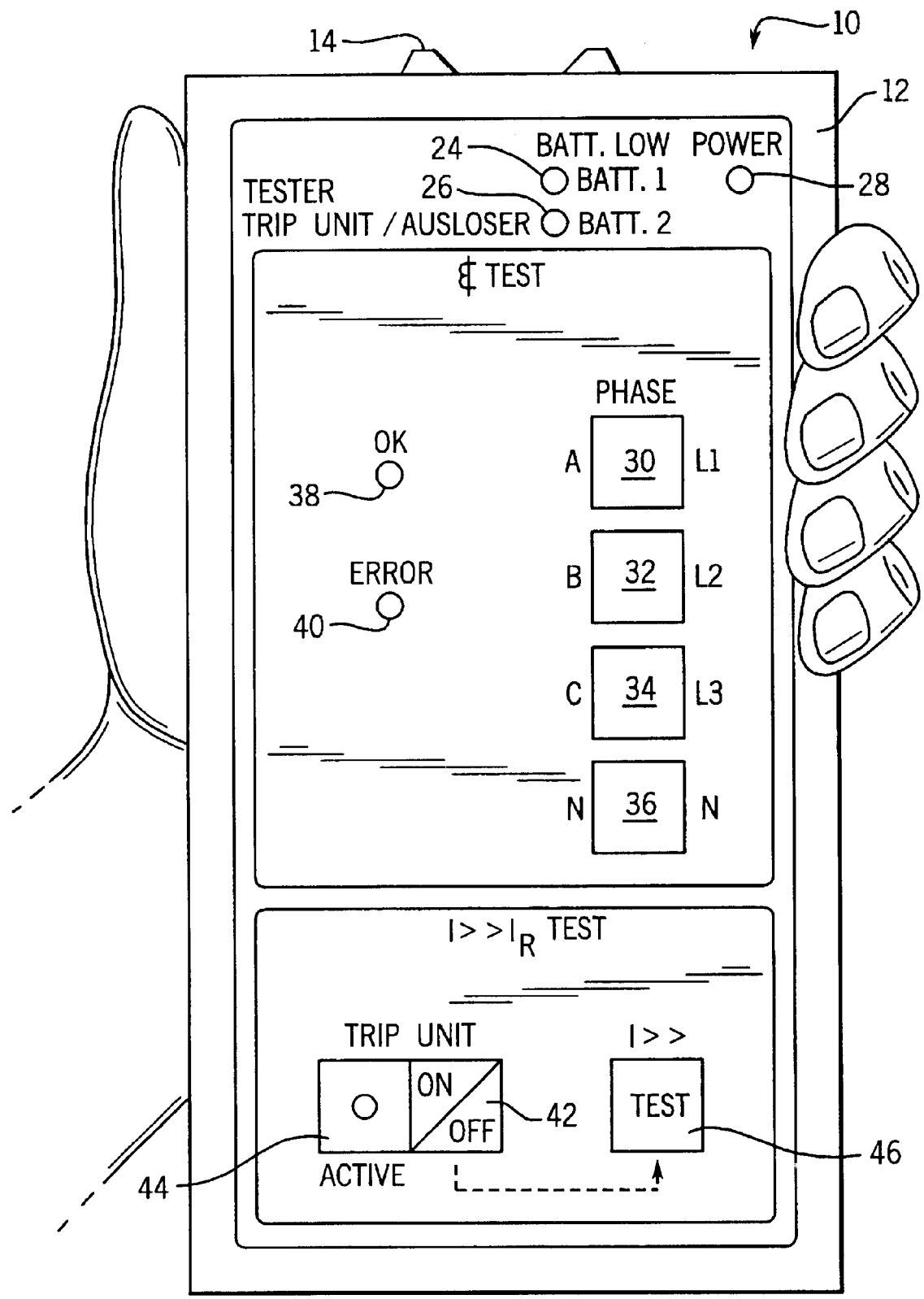
FIG. 1A is a front view of a portable tester for testing circuit breakers according to an exemplary embodiment of the present invention.
Figure 1B:
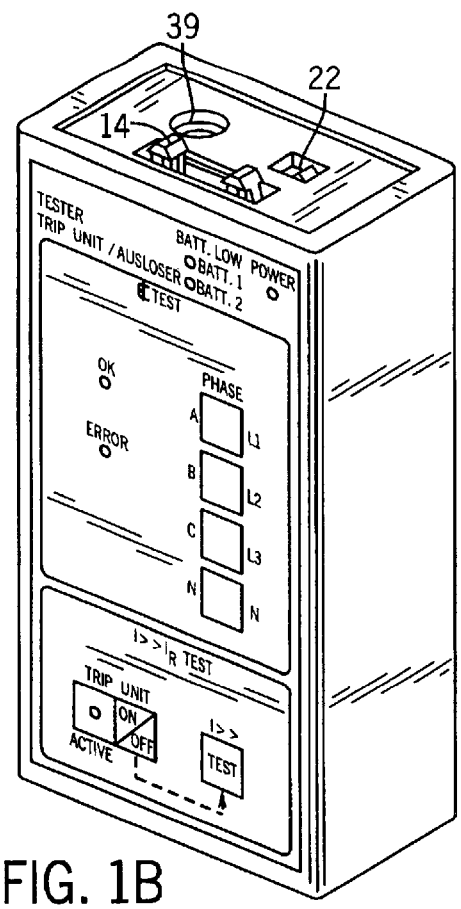
FIG. 1B is a top perspective view of the portable tester of FIG. 1A.
Figure 1C:
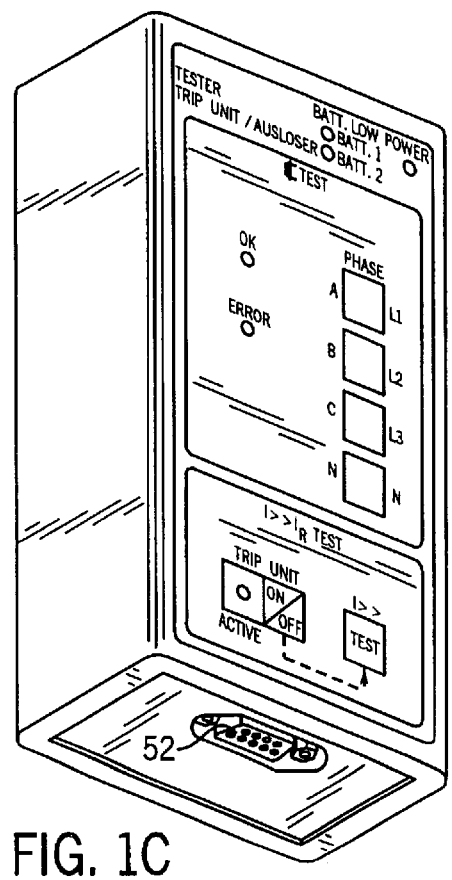
FIG. 1C is a bottom perspective view of the portable tester of FIG. 1.

Referring first to FIGS. 1A–1C, a portable tester 10 for testing a circuit breaker is disclosed. Portable tester 10 is encased in a housing 12 configured to be held in an operator's hand. In this exemplary embodiment, housing 12 is approximately six inches by three inches by two inches in size. Portable tester 10 is configured to perform testing operations on a circuit breaker (see FIG. 2). The compact size of portable tester 10 allows easy portability, storage and transportation to and from a work site where circuit breakers are in operation. Portable tester 10 also is of sufficiently small size to be placed in a tool box.

Portable tester 10 includes a test port 14 configured for coupling to the circuit breaker to be tested. In this embodiment, test port 14 couples electrically to the circuit breaker via a communications medium, such as, a transistor-transistor logic (TTL) communications link 16 (FIG. 2) or radio frequency signal to the circuit breaker. Portable tester 10 performs two testing operations on the circuit breaker: the first testing operation verifies that the current transformers of the circuit breaker have electrical continuity; the second testing operation verifies that the circuit breaker can power-up and function properly under a minimum functional power level. Preferably, the testing takes place on a circuit breaker which is not on-line, i.e., not currently in operation.

Figure 2:
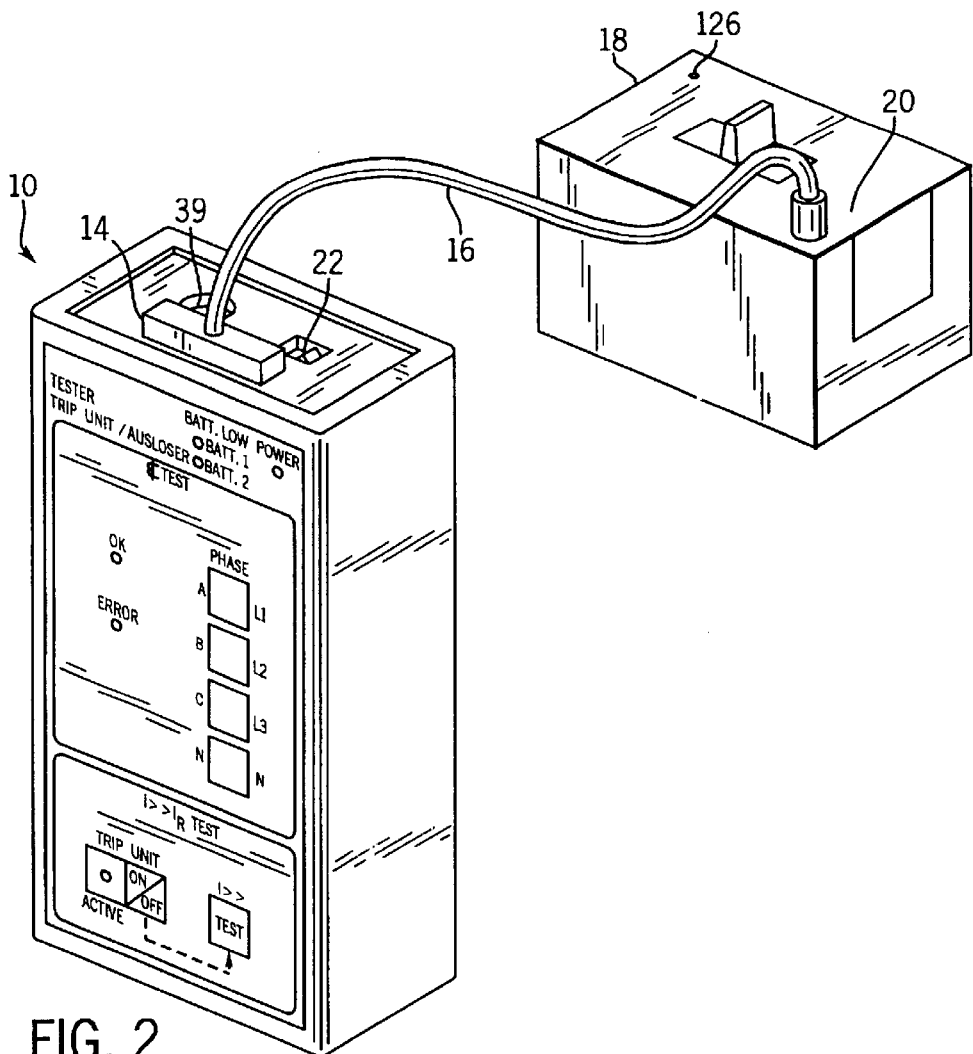
FIG. 2 is a perspective view of the portable tester of FIG. 1A coupled to a circuit breaker during an exemplary testing operation.

Referring to FIG. 2, a circuit breaker to be tested 18 includes a connector 20 which, in this embodiment, is a twelve-pin connector coupled to communications link 16 of portable tester 10. Connector 20 enables testing of circuit breaker 18, communication between tester 10 and circuit breaker 18, and communication between circuit breaker 18 and a computer (not shown) via tester 10. Circuit breaker 18 further includes an electronic module (e.g., an electronic trip unit) configured to monitor line inputs for each of A+ phase, B+ phase, C+ phase, and N− phase of a 3-phase alternating-current (AC) power signal. Alternatively, circuit breaker 18 may monitor a single phase AC power source. The electronic module is configured to trip a trip mechanism, separating a source from a load if an abnormal condition (e.g., overcurrent, ground fault, etc.) is detected.

To perform either or both testing operations, the operator couples portable tester 10 to circuit breaker 18 (FIG. 2) and adjusts a power switch 22 having ON and OFF positions to the ON position. In this embodiment, portable tester 10 is battery powered by, for example, three nine-volt batteries. The first two batteries comprise a first battery unit and the third battery comprises a second battery unit. Tester 10 includes a battery tester which continuously monitors the condition of the first and second battery units. If the first battery unit is low, a first red indicia 24 (e.g., light-emitting diode or LED) is displayed. If the second battery unit is low, a second red indicia 26 is displayed. A green indicia 28 is displayed when switch 22 is in the ON position. Alternatively, portable tester 10 may by powered externally by an AC/DC power source via DC power in terminal 29.

Once portable tester 10 is powered and properly coupled to circuit breaker 18, the operator may perform either of the two testing operations or the communications feature. To perform the first testing operation, the operator presses one of phase A+ switch 30, phase B+ switch 32, phase C+ switch 34 and phase N− switch 36. In response to actuation of one of switches 30, 32, 34 and 36, the test circuit inside portable tester 10 tests the respective current transformer in circuit breaker 18 to see if the respective current transformer is operational (i.e., has continuity within the circuit), as will be described in greater detail hereinafter. If the current transformer being tested has continuity, a green indicia 38 (i.e., "OK") is displayed. If not, a red indicia 40 (i.e., "Error") is displayed.

To perform the second testing operation, the operator presses an electronic module power switch 42 which toggles between ON and OFF positions. In response to actuation of electronic module power switch 42 to the ON position, the test circuit inside portable tester 10 provides power to the electronic module of circuit breaker 18. The power provided is approximately a minimum level of power the circuit breaker 18 requires to be operational. When portable tester 10 is providing power to circuit breaker 18, a yellow indicia 44 (i.e., "ACTIVE") on portable tester 10 is displayed. If circuit breaker 18 is provided with sufficient operational power, a green indicia 126 on circuit breaker 18 will flash. Therefore, if yellow indicia 44 on portable tester 10 is lit, but green indicia 126 is not flashing, the operator knows there is a malfunction. Next, the operator performs an overcurrent test on circuit breaker 18 by actuating an overcurrent test switch 46. In response, the test circuit provides a test current to a line input of circuit breaker 18 (e.g., the A+ phase line input). If circuit breaker 18 is operational, the trip mechanism on circuit breaker 18 will trip. If circuit breaker 18 is not operational, the trip mechanism will not trip, indicating a malfunction to the operator.

Figure 9:
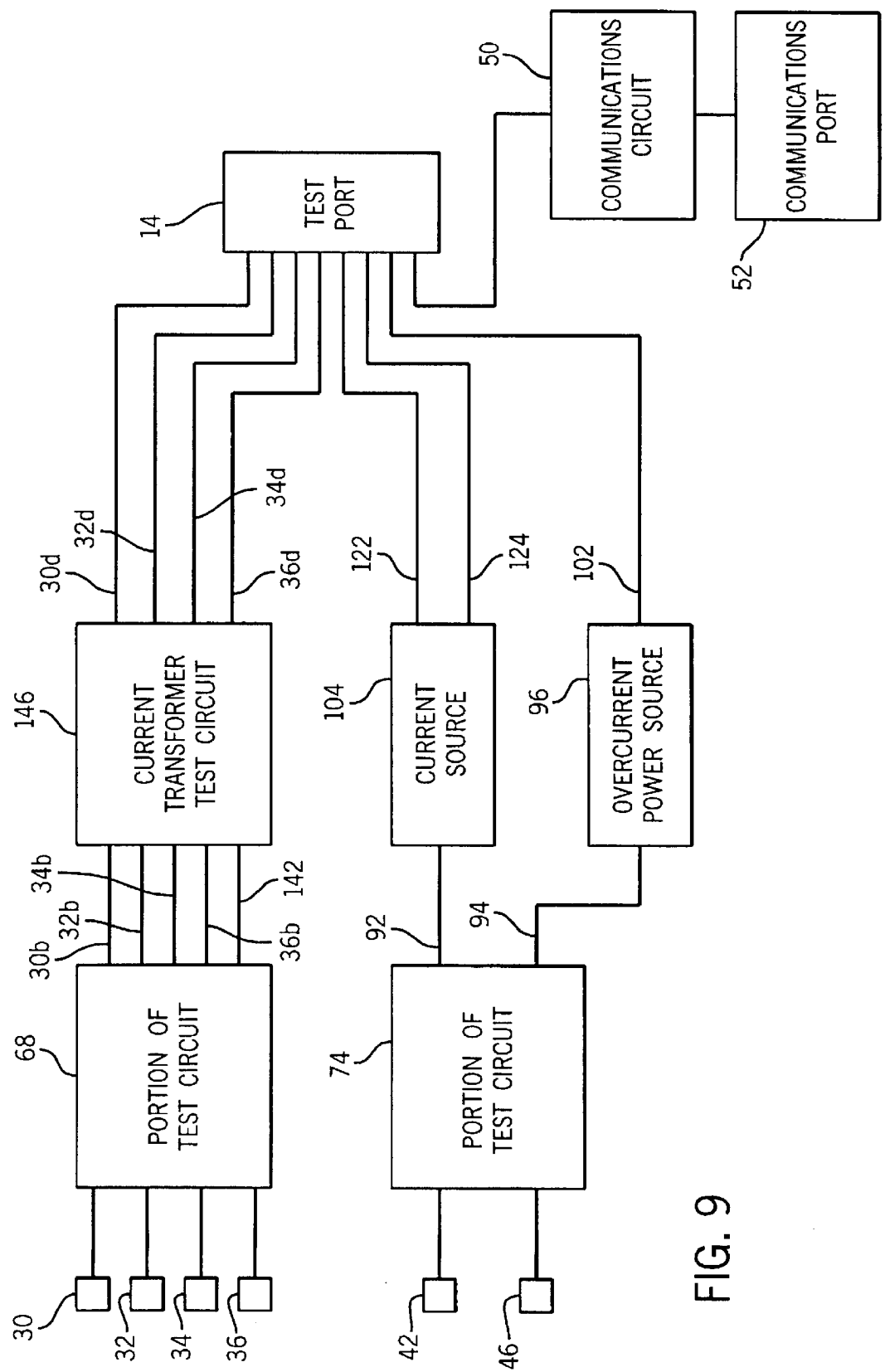
FIG. 9 is a block diagram composite of the portable tester of FIG. 1A.

FIG. 9 is a block diagram composite of FIGS. 3–7 showing a simplified view of circuits 50, 68, 74, 96, 104, and 146, which will now be described in greater detail.

Figure 3:
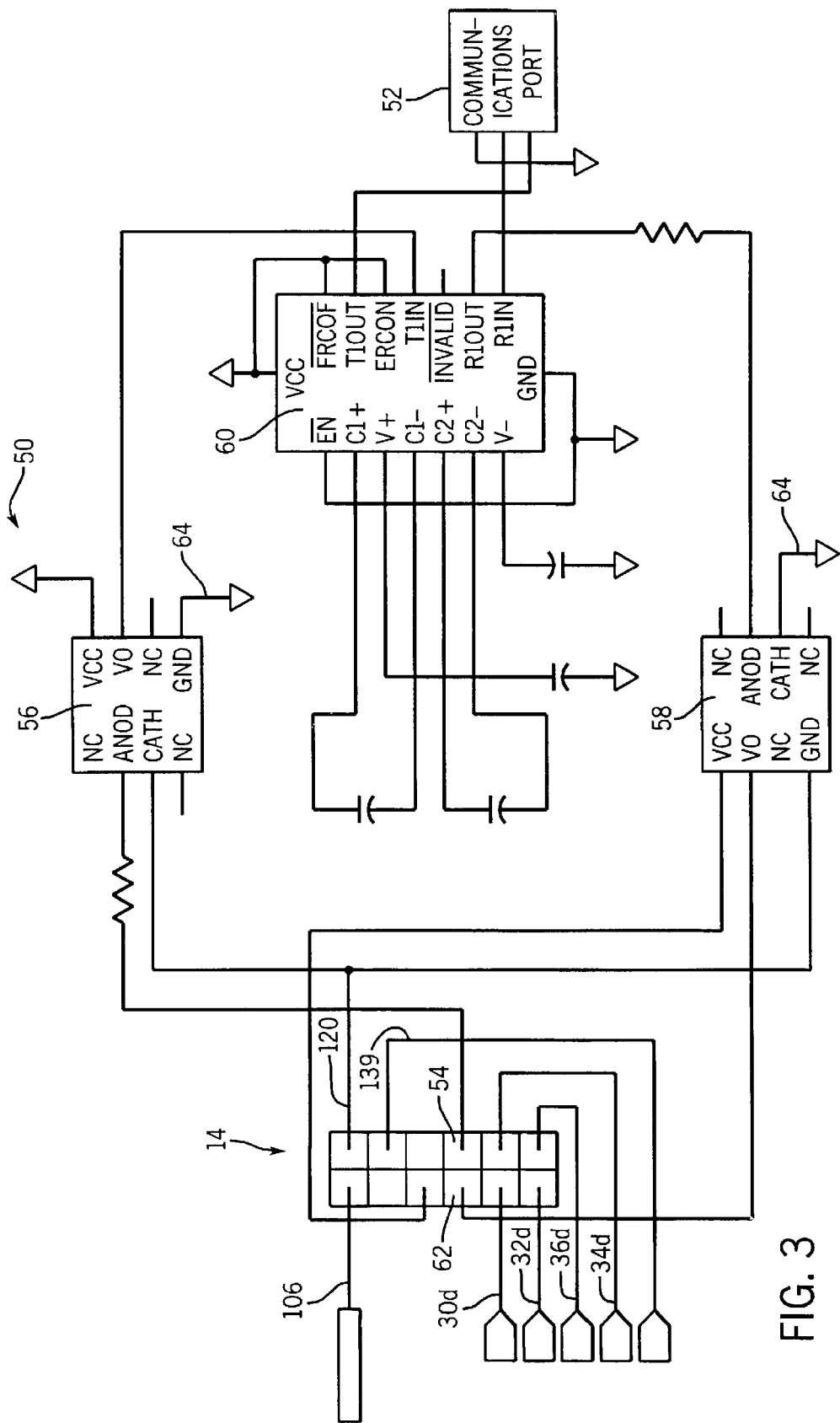
FIG. 3 is a schematic diagram of a communications circuit according to an exemplary embodiment of the portable tester of FIG. 1A.

Referring now to FIG. 3, a third function of portable tester 10 is disclosed. Tester 10 includes a communications circuit 50 which manages communications between circuit breaker 18 and a personal computer (PC) via test port 14 and a communications port 52, for example, a nine-pin connector (see also FIG. 1C). Serial data is received in transistor-transistor logic (TTL) form from circuit breaker 18 at a terminal 54 and is transmitted to the anode of an optocoupler 56. The output voltage VO of optocoupler 56 is connected as an input signal to a communications converter 60. Communications converter 60, in turn, converts the TTL signal to an RS-232 serial data signal and transmits this signal to communications port 52 which is coupled to the PC (not shown). The PC may also transmit a serial signal through communications port 52 to converter 60, which converts the signal from RS-232 to TTL. The TTL signal travels through an optocoupler 58 to terminal 62 and to the control circuit within circuit breaker 18. Optocouplers 56 and 58 serve to isolate circuit breaker ground at a terminal 120 from a PC ground at a terminal 64. Thus, communications circuit 50 enables bidirectional communication between a PC and a control circuit within the circuit breaker. In this embodiment, power switch 22 must be in the ON position to enable the communications.

Figure 4:
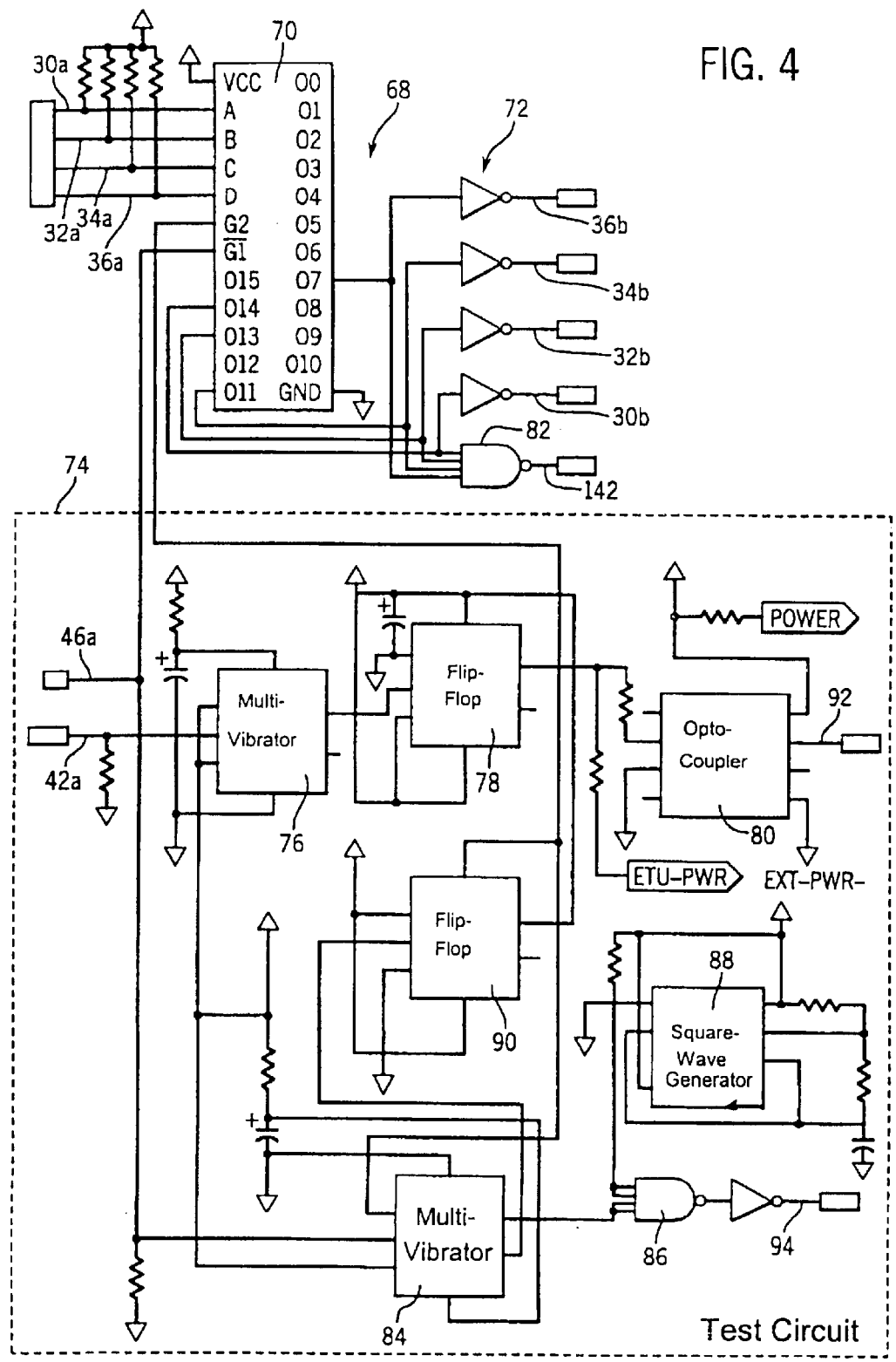
FIG. 4 is a schematic diagram of a portion of a test circuit according to an exemplary embodiment of the portable tester of FIG. 1A.

Referring now to FIGS. 4–7, a more detailed disclosure of one exemplary embodiment of the first and second testing operations will be provided. In FIG. 4, a portion 68 of the test circuit is disclosed which interfaces with switches 30, 32, 34, 36, 42, and 46. Phase switches 30, 32, 34, and 36 are coupled to pulled-up terminals 30a, 32a, 34a, and 36a, respectively, and pull their respective terminals to ground when actuated. Terminals 30a–36a are input to a demultiplexer 70 (e.g., a 74HC154 chip). Demultiplexer 70 ensures that only one of switches 30–36 is actuated at a time, in order to test only one current transformer within circuit breaker 18 at a time. The one phase which is to be tested is enabled at one of phase enable terminals 30b, 32b, 34b, and 36b through a respective one of inverters 72. Demultiplexer 70 also prevents testing of any of phases A+, B+, C+ or N− when portable tester 10 is powering circuit breaker 18 or providing an overcurrent signal to circuit breaker 18 during the second testing operation. This functionality is provided by coupling electronic module power switch 42 and overcurrent test switch 46 to an electronic module power terminal 42a and an overcurrent test terminal 46a, respectively, which are coupled to two enable inputs of demultiplexer 70. A NAND gate 82 provides as an output an enable signal for the four current transformer tests, having as inputs the four outputs of demultiplexer 70. Further disclosure of the first testing operation is continued below with reference to FIG. 7.

Another portion 74 of the test circuit activates the second testing operation including providing power to the electronic module of the circuit breaker and performing the overcurrent test. Electronic module power terminal 42a is coupled through a monostable multivibrator 76 and a flip-flop 78 to an optocoupler 80 (e.g., an HCPL0201 chip). Multivibrator 76 removes power from the electronic module shortly after the overcurrent test is completed. Flip-flop 78 allows switch 42 to be used to toggle power to the trip unit ON and OFF. Optocoupler 80 isolates power between the first and second battery units. The second battery unit, comprising one nine volt battery, powers the logic of portion 74, and the first battery unit, comprising two nine volt batteries, provides power to the electronic module via the current source of FIG. 5. Optocoupler 80 provides, as an output, an electronic module power enable signal on electronic module power enable terminal 92. The output of flip-flop 78 is coupled to flip-flip 90 which ensures that the overcurrent test signal is not applied unless power is first enabled via electronic module power switch 42.

Overcurrent test terminal 46a is coupled to a monostable multivibrator 84 which provides a time limit on the overcurrent test (e.g., 0.5 seconds in this example). The output of multivibrator 84 is coupled to one input of a NAND gate 86 while the other input of NAND gate 86 is coupled to a square wave generator 88 (e.g., an LMC555 chip). An alternating current (AC) waveform is used as the overcurrent test signal in this embodiment. The square wave output from the output of NAND gate 86 is an overcurrent test enable signal comprising a TTL signal which provides the necessary AC waveform for the overcurrent test signal. This TTL signal is provided on an overcurrent enable terminal 94.

Figure 5:
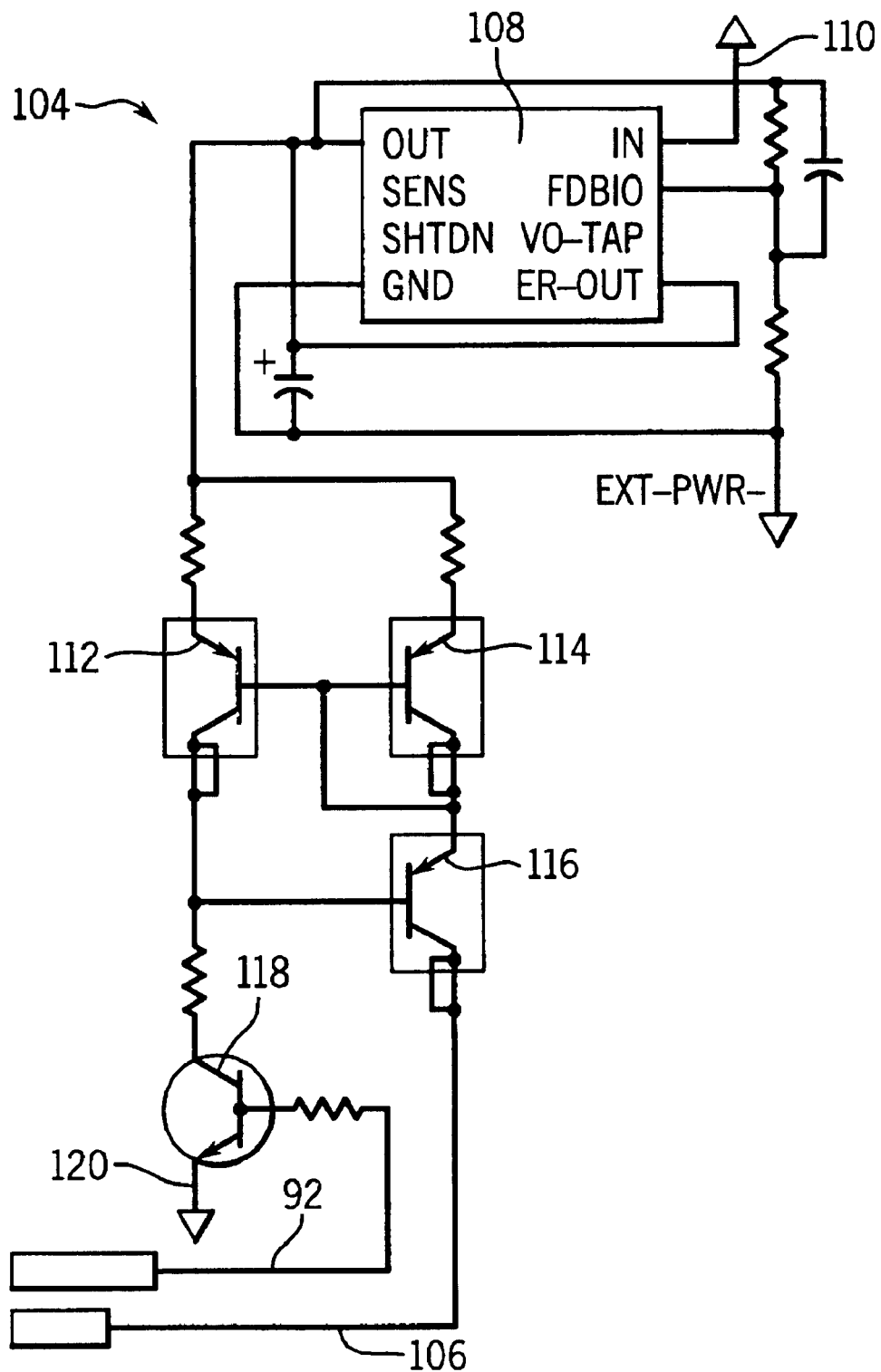
FIG. 5 is a schematic diagram of a first current source according to an exemplary embodiment of the portable tester of FIG. 1A.

Referring now to FIG. 5, a current source 104 for powering the electronic module is disclosed. Electronic module power enable terminal 92 is provided as an input to current source 104. The output of current source 104 is a power signal provided at circuit breaker power terminal 106 sufficient to power circuit breaker 18 during the overcurrent test. A voltage regulator 108 (e.g., an LP2951 chip) is coupled to an eighteen volt (18 V) supply rail 110 provided by the first battery unit. Voltage regulator 108 provides power through transistors 112, 114 and 116 to circuit breaker power terminal 106. Transistor 118 provides a negative circuit breaker power terminal 120 at its emitter. Referring to FIG. 3, test port 14 is coupled to terminals 106 and 120 to provide circuit breaker power to circuit breaker 18. In this embodiment, a minimal amount of current sufficient to power circuit breaker 18 is provided and circuit breaker 18 provides an indicia 126 (e.g., a green LED) to indicate that the electronic module therein is being powered. This test provides an indication to the operator that the electronic module is functional.

Figure 8:
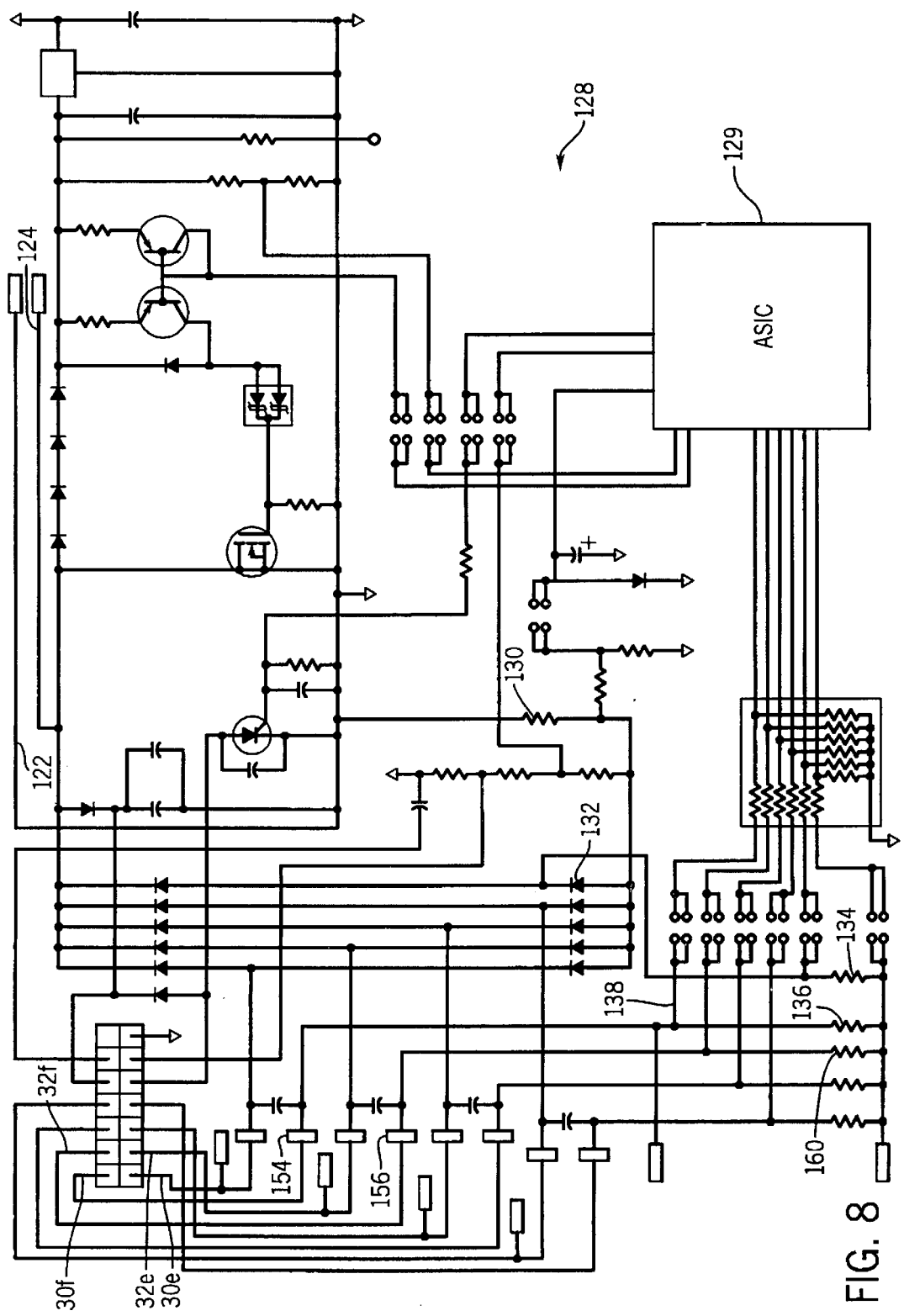
FIG. 8 is a schematic diagram of a portion of the circuit breaker of FIG. 2.

Referring to FIG. 8, FIG. 8 discloses a portion 128 of a control circuit for circuit breaker 18. Circuit breaker power terminal 106 and negative circuit breaker power terminal 120 are coupled to test port 14 to provide power to the circuit breaker via link 16 to circuit breaker power terminals 124 and 122, respectively. Thus, circuit breaker 18 is powered by the test circuit of portable tester 10.

Figure 6:
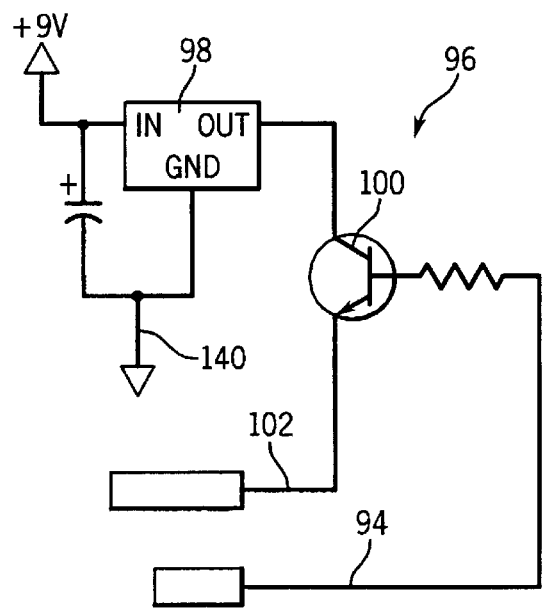
FIG. 6 is a schematic diagram of a second current source according to an exemplary embodiment of the portable tester of FIG. 1A.

Referring now to FIG. 6, overcurrent enable terminal 94 is coupled to an overcurrent power source 96 comprising a voltage regulator 98 and a transistor 100. In response to overcurrent test enable signal being provided at the base of transistor 100, a test current sufficient to trip the trip mechanism of circuit breaker 18 is generated at test current terminal 102. This test current is substantially lower than a rating associated with circuit breaker 18 being tested. Therefore, circuit breaker 18 must be adjusted to a low trip setting before performing the overcurrent test.

The test current is provided to circuit breaker 18 via test port 14 (FIG. 3) to circuit breaker power terminals 122, 124 (see FIG. 8). The test current travels into terminal 122, through resistor 130, through diode 132 from anode to cathode, through resistor 134, through resistor 136 to a universal output terminal 138. The function of resistors 130, 134 during normal operation is described in commonly assigned U.S. patent application Ser. No. 09/435,186 titled "Method and Apparatus for Differentially Sensing Ground Fault and Individual Phases" by Bilac et al., herein incorporated by reference. Portion 128 further includes an application specific integrated circuit 129, the functionality of which is described in commonly assigned U.S. patent application Ser. No. 09/435,110 titled "Circuit Breaker having Programmable Amplifier" by Bilac, herein incorporated by reference. Current then returns to return terminal 140 of overcurrent power source 96. This current path will trip circuit breaker 18 provided circuit breaker 18 is operational.

In one embodiment, circuit breaker 18 is a line protection circuit breaker in which the test current performs a long time trip test and an instantaneous trip test (i.e., circuit breaker 18 is tripped when a composite signal on resistor 134 is greater than the instantaneous trip level of circuit breaker 18), but not a short time trip test. In another embodiment, circuit breaker 18 is a long time/short time circuit breaker having a preset instantaneous trip value for the short time trip too high for the current source capability of overcurrent power source 96 of the preferred embodiment of portable tester 10. Therefore, the short time trip current is tested during the first testing operation instead of the second testing operation based on current flow through resistor 136, indicating current through the A+ phase current transformer (as described with reference to FIG. 7 below). As indicated hereinabove, circuit breaker 18 must be set to its minimum trip current values during the second testing operation due to the limited current available from portable tester 10.

Figure 7:
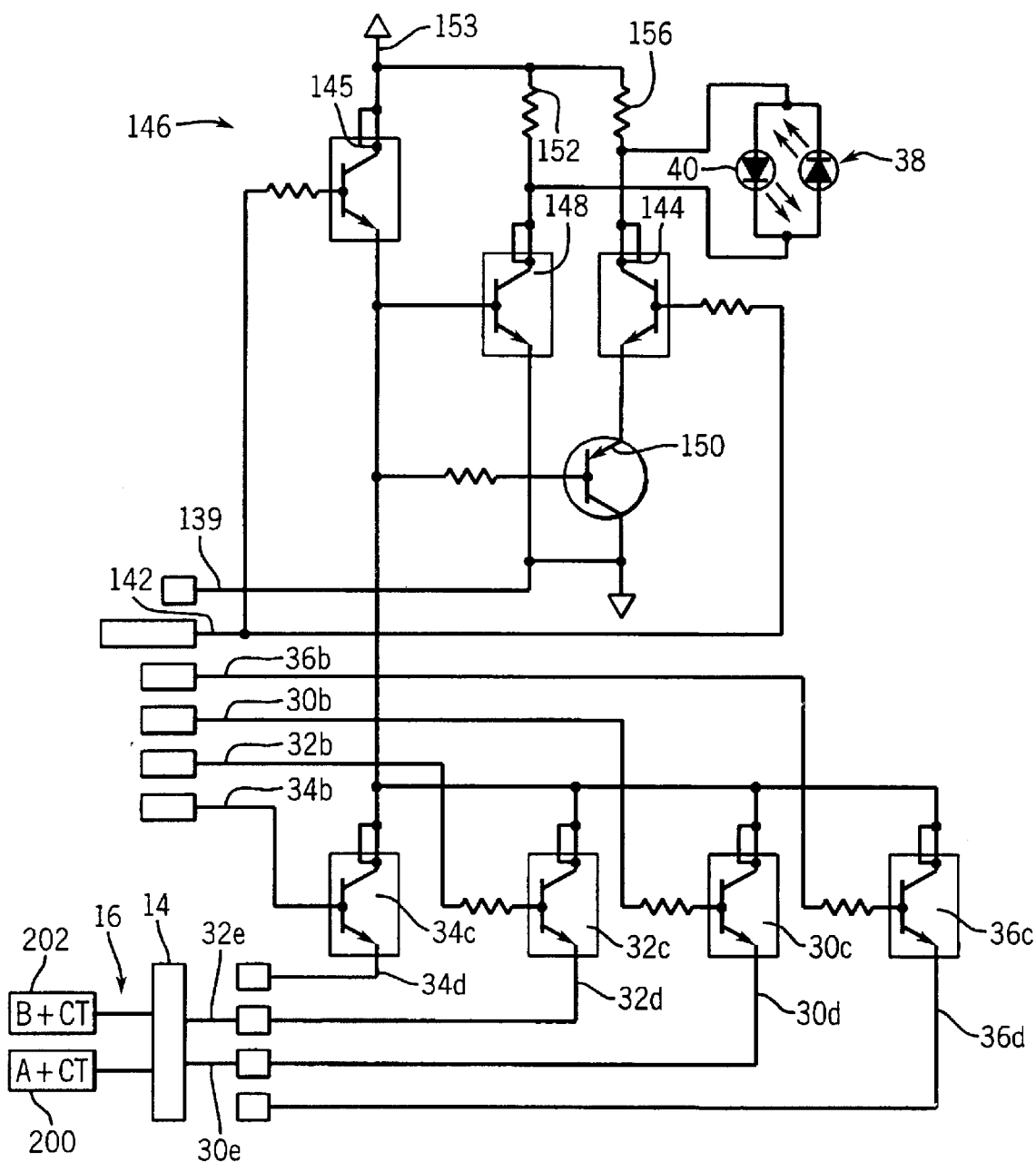
FIG. 7 is a schematic diagram of a portion of a test circuit according to an exemplary embodiment of the portable tester of FIG. 1A.

Referring now to FIG. 7, an exemplary embodiment of the first testing operation will be described. As described hereinabove with reference to FIG. 4, when one of phase switches 30, 32, 34, and 36 is actuated by the operator, a phase enable signal for one of the respective phases (A+, B+, C+ or N−) is provided on one of phase enable terminals 30b, 32b, 34b, and 36b and a transformer enable signal generated by NAND gate 82 (FIG. 4) is provided on a transformer enable terminal 142. The transformer enable signal is provided to the bases of transistors 144 and 145 to enable current to a current transformer test circuit 146 only during the first testing operation (i.e., when one of switches 30–36 is pressed).

With reference to FIG. 7, a "pass" and a "fail" condition will both be described for testing the A+ phase of circuit breaker 18 during the first testing operation. To achieve a "pass", when phase enable terminal 30b receives a phase enable signal, a transistor 30c is turned on which pulls the base of NPN transistor 148 low, turning it off and pulls the base of PNP transistor 150 low, turning it on. Emitter terminal 30d of transistor 30c sinks current only if the test is a "pass" as will now be described. Emitter terminal 30d is coupled through test port 14 (FIG. 3) to an A+ phase current transformer (CT) 200 of circuit breaker 18. A+ phase CT 200 is coupled between terminals 30e and 30f in FIG. 8, but is not illustrated in FIG. 8. A+ phase CT 200 is a coil of wire wrapped around or near a line input for the A+ phase of the power signal. Provided A+ phase CT 200 forms a complete circuit (i.e., has no open circuit or other anomaly), current flows from terminal 30e through A+ phase CT 200 to a second circuit breaker test terminal 30f, through a ferrite bead 154 to universal output terminal 138. Terminal 138 is coupled to the portable tester 10 through test port 14 (FIG. 3) at terminal 139 which is coupled to the emitter of transistor 148 and provides a ground therefor. In response, current flows through a resistor 152 (e.g., a 1.47 kOhm resistor) coupled between a power terminal 153 and the collector terminal of transistor 148 through green indicia 38 (indicating a "pass"), through transistor 144 and transistor 150 to ground terminal 139.

However, if A+ phase CT 200 circuit has an open circuit, transistor 30c is off since emitter 30d does not sink current. Then, transistor 150 is off and transistor 148 (an NPN transistor) is on. Then, the only current path is through a resistor 156 (e.g., a 2.2 kOhm resistor) coupled between the power terminal 153 and the collector of transistor 144 through red indicia 40 to indicate to the operator a "fail".

During the B+ phase CT test, the path through circuit breaker 18 (FIG. 8) is somewhat nonanalogous to that of the A+ phase current path. This change is made to reduce the number of pins needed to perform the test by having all phase tests share one universal output terminal 138. Therefore, for the B+ phase CT test, current is provided at terminal 32e, through a B+ phase CT 202, through terminal 32f, through ferrite bead 156, through a resistor 160 (e.g., a one ohm resistor), through resistor 136 (e.g., a one ohm resistor) and to universal output terminal 138. The C+ phase CT test and N− phase CT test circuits are analogous to the B+ phase CT test circuit. Thus, it can be seen that all phase test circuits share one return output terminal, universal output terminal 138. This feature contributes to the compact size of portable tester 10.

While the embodiments illustrated in the FIGURES and described above are presently preferred, it should be understood that these embodiments are offered by way of example only. For example, while the preferred embodiment is directed to a portable tester for a three-phase circuit breaker, a portable tester for a single-phase circuit breaker is also contemplated. The invention is not limited to a particular embodiment, but extends to various modifications that nevertheless fall within the scope of the appended claims.

What is claimed is:

1. A circuit breaker tester for testing a current transformer of a circuit breaker, the current transformer having a first terminal on a first end of the transformer and a second terminal on a second end of the transformer, comprising:
   a housing configured to be held in a hand;
   a test port coupled to the housing and configured to be coupled to the first and second terminals;
   a test circuit coupled to the test port and configured to provide a test current through the test port to the first terminal, to monitor the second terminal through the test port, and to provide an output signal to an indicia based on whether the test current is received at the second terminal, and further comprising:
   a second current transformer of a three-phase circuit breaker, the second current transformer having a third terminal on a first end of the second current transformer and the second terminal on a second end of the second current transformer, wherein the test port is further configured to be coupled to the third terminal, and the test circuit is further configured to provide the test current through the test port to the third terminal, to monitor the second terminal through the test port, and to provide an output signal to the indicia based on whether the test current is received at the second terminal in response to providing the test current at the third terminal.

2. The circuit breaker tester of claim 1, wherein the output signal illuminates a light-emitting diode when the test current is received at the second terminal.

3. The circuit breaker tester of claim 1, further comprising a switch, the test circuit configured to provide the test current in response to operator actuation of the switch.

4. The circuit breaker tester of claim 1, wherein the test current is substantially lower than a rating associated with the circuit breaker being tested.

5. The circuit breaker tester of claim 4, wherein the rating is between approximately 63 Amperes and 1600 Amperes.

6. A portable tester for testing a circuit breaker having an electronic module and a current transformer, comprising:
   a housing configured to be held in a hand;
   a test port coupled to the housing and configured for coupling to the circuit breaker;
   a communication circuit configured to provide communication between the electronic module of the circuit breaker and a personal computer, and
   a test circuit coupled to the housing and the test port configured to perform first and second testing operations on the circuit breaker through the test port, wherein during the first testing operation the test circuit provides a test signal to a terminal coupled to the current transformer and during the second testing operation the test circuit provides power to the electronic module of the circuit breaker.

7. The portable tester of claim 6, the test circuit further configured to provide a test current to a trip unit associated with the circuit breaker during the second testing operation.

8. The portable tester of claim 6, wherein the test circuit is configured to be powered by a battery.

9. The portable tester of claim 8, wherein the test current is substantially lower than a rating associated with the circuit breaker being tested.

10. The portable tester of claim 9, wherein the rating is between approximately 63 Amperes and 1600 Amperes.

11. The portable tester of claim 6, further comprising a power port coupled to the test circuit configured to power the test circuit via an external power supply.

12. The portable tester of claim 6, wherein during the first testing operation, the test circuit is configured to receive a return test signal representative of the condition of the current transformer.

13. The portable tester of claim 12, further comprising a switch, the test circuit configured to provide the test signal in response to operator actuation of the switch and to provide an indicia to the operator based on the return test signal.

14. The portable tester of claim 13, wherein the indicia includes an audible tone.

15. The portable tester of claim 6, further comprising a switch, the test circuit configured to power the electronic module during the second testing operation in response to operator actuation of the switch.

16. The portable tester of claim 15, further comprising a second switch, the test circuit configured to provide a test current in response to operator actuation of the second switch, wherein the test current is sufficient to trip the circuit breaker.

17. A circuit breaker tester for testing a current transformer of a circuit breaker, comprising:
　　means for providing a test current through the current transformer;
　　means for receiving the test current from the current transformer; and
　　means for providing an output signal to an indicia based on whether the test current is received at the means for receiving.

18. The circuit breaker tester of claim 17, further comprising:
　　means for providing a second test current through a second current transformer;
　　means for receiving the second test current from the second current transformer including a terminal coupled to the means for receiving the test current;
　　wherein the means for providing an output signal provides the output signal to the indicia based on whether the second test current is received at the terminal.

* * * * *